United States Patent
Yoshida et al.

(10) Patent No.: US 10,210,922 B2
(45) Date of Patent: Feb. 19, 2019

(54) APPARATUS AND METHODS FOR REFRESHING MEMORY CELLS OF A SEMICONDUCTOR DEVICE

(71) Applicant: MICRON TECHNOLOGY, INC., Boise, ID (US)

(72) Inventors: Kenji Yoshida, Tokyo (JP); Hiroki Fujisawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/962,886

(22) Filed: Apr. 25, 2018

(65) Prior Publication Data

US 2018/0240511 A1 Aug. 23, 2018

Related U.S. Application Data

(60) Division of application No. 15/499,568, filed on Apr. 27, 2017, now Pat. No. 9,984,738, which is a continuation of application No. 14/447,287, filed on Jul. 30, 2014, now Pat. No. 9,786,352.

(30) Foreign Application Priority Data

Jul. 31, 2013 (JP) ................................. 2013-159058

(51) Int. Cl.
| | | |
|---|---|---|
| G11C 7/00 | (2006.01) | |
| G11C 11/406 | (2006.01) | |
| G11C 11/4074 | (2006.01) | |
| G11C 11/4076 | (2006.01) | |
| G11C 11/4094 | (2006.01) | |

(52) U.S. Cl.
CPC .... *G11C 11/40626* (2013.01); *G11C 11/4074* (2013.01); *G11C 11/4076* (2013.01); *G11C 11/4094* (2013.01); *G11C 11/40611* (2013.01); *G11C 11/40615* (2013.01); *G11C 2211/4061* (2013.01)

(58) Field of Classification Search
CPC .......... G11C 11/40626; G11C 11/4094; G11C 11/40615
USPC ...................................................... 365/222
See application file for complete search history.

(56) References Cited

U.S. PATENT DOCUMENTS

| | | | |
|---|---|---|---|
| 5,027,327 A | 6/1991 | Kobayashi et al. | |
| 5,406,522 A | 4/1995 | Hirano | |
| 5,532,968 A * | 7/1996 | Lee ....................... | G11C 11/406 365/189.07 |

(Continued)

*Primary Examiner* — Tha-O H Bui
(74) *Attorney, Agent, or Firm* — Dorsey & Whitney LLP (57) ABSTRACT

Apparatuses and methods for refreshing memory cells of a semiconductor device are described. An example apparatus includes: a memory cell array including a plurality of memory groups each having a plurality of memory cells, the memory groups being selected by mutually different addresses; a first control circuit periodically executing a refresh operation on the memory groups in response to a first refresh command; and a second control circuit setting a cycle of executing the refresh operation by the first control circuit. The second control circuit sets the cycle to a first cycle until executing the refresh operation to all the memory groups after receiving the first refresh command, and the second control circuit sets the cycle to a second cycle that is longer than the first cycle after executing the refresh operation to all the memory groups.

20 Claims, 9 Drawing Sheets

(56) References Cited

U.S. PATENT DOCUMENTS

| | | |
|---|---|---|
| 5,644,545 A | 7/1997 | Fisch |
| 5,966,725 A | 10/1999 | Tabo |
| 6,721,225 B2 | 4/2004 | Tsukude |
| 7,196,956 B2 | 3/2007 | Shirota et al. |
| 7,990,795 B2 | 8/2011 | Pelley, III et al. |
| 8,144,539 B2 | 3/2012 | Lim et al. |
| 8,867,293 B2 | 10/2014 | Shirota et al. |
| 8,891,327 B2 | 11/2014 | Kim |
| 8,995,216 B2 | 3/2015 | Furutani |
| 9,786,352 B2 | 10/2017 | Yoshida et al. |
| 2013/0308405 A1* | 11/2013 | Jeong ................ G11C 7/00 365/222 |
| 2017/0229165 A1 | 8/2017 | Yoshida et al. |

* cited by examiner

APPARATUS AND METHODS FOR REFRESHING MEMORY CELLS OF A SEMICONDUCTOR DEVICE

CROSS-REFERENCE TO RELATED APPLICATIONS

This application is a divisional of U.S. patent application Ser. No. 15/499,568, filed Apr. 27, 2017, issued as U.S. Pat. No. 9,984,738 on May 29, 2018, which is a continuation of U.S. patent application Ser. No. 14/447,287, filed Jul. 30, 2014, issued as U.S. Pat. No. 9,786,352 on Oct. 10, 2017, which claims the filing benefit of JP Application No. 2013-159058, filed Jul. 31, 2013. These applications and patents are incorporated by reference herein in their entirety and for all purposes.

BACKGROUND OF THE INVENTION

Field of the Invention

Embodiments of the present invention relate to a semiconductor device, and more particularly relates to a semiconductor device including a plurality of memory cells in which a refresh operation is necessary to retain information.

Description of Related Art

In a volatile memory device of a charge retention type represented by a DRAM (Dynamic Random Access Memory), it is necessary to cyclically execute a refresh operation as recharging in order to retain data of memory cells. The cycle of executing the refresh operation is decided based on a period in which the memory cells can retain data (hereinafter referred to as "a data retention period").

In recent years, in view of reducing power consumption of the semiconductor device, it is desired that the cycle of executing a refresh operation is extended as long as possible. For example, Japanese Patent Application Laid-Open No. H7-296582 focuses on a relationship between a temperature and a data retention period and discloses a semiconductor device that changes the cycle of executing a refresh operation according to values indicated by a temperature sensor.

SUMMARY

The present invention realizes reduction of power consumption without losing data of memory cells in controlling a refresh operation cycle.

In one embodiment, there is provided a semiconductor device that includes: a memory cell array including a plurality of memory groups each having a plurality of memory cells, the memory groups being selected by mutually different addresses; a first control circuit periodically executing a refresh operation on the memory groups in response to a first refresh command; and a second control circuit setting a cycle of execution the refresh operation by the first control circuit. The second control circuit sets the cycle to a first cycle until executing the refresh operation to all the memory groups after receiving the first refresh command, and the second control circuit sets the cycle to a second cycle that is longer than the first cycle after executing the refresh operation to all the memory groups.

In another embodiment, there is provided a semiconductor device that includes: a memory cell array including a plurality of memory cells in which a refresh operation is necessary to retain information; and a refresh control circuit periodically executing the refresh operation on the memory cells in response to a refresh command. The refresh control circuit executes the refresh operation at a first cycle until a first predetermined period elapsed after the refresh command is issued, and the refresh control circuit executes the refresh operation at a second cycle that is longer than the first cycle after the first predetermined period elapsed.

According to the embodiments of the present invention, it is possible to reduce power consumption without losing data of memory cells.

DETAILED DESCRIPTION OF THE EMBODIMENTS

The following descriptions are contents provided by the studies of the present inventors.

In semiconductor devices of recent years, reduction of power consumption has been strongly demanded as well as high speed of operations, and securing of an operation margin for achieving the both aspects, which are originally in a trade-off relationship, has been much difficult. In this connection, if a write operation is focused, the following two points need to be taken into consideration.

(1) In order to reduce power consumption, a voltage for writing is stepped down, and thus the amount of charges to be applied to memory cells is decreased.

(2) In order to realize high speed operations, a write period is shortened, and thus the amount of charges to be applied to memory cells is decreased.

The (1) and (2) mentioned above are causes for shortening a refresh cycle. The "refresh cycle" is a period required for refreshing all the memory cells, and it is specified by corresponding standards to be equal to or longer than 64 msec, for example. In this example, a case where the signal amount of the memory cells becomes smallest is a case where, at the time of a write operation, on memory cells in which data at a high level (or a low level) is stored, data of a low level (or a high level) which is a reversed one of the high level (or the low level), is overwritten.

In this example, if the charge amount in the above case is designated as Qmin, an actual refresh cycle needs to be set on an assumption that the charge amount of the respective memory cells is Qmin. However, in a refresh operation, because the charge amount of the respective memory cells is reproduced to a sufficient extent, a charge amount (Qref) of the memory cells after the refresh operation is set to be Qref>Qmin.

This is because a time for rewriting the same data on the memory cells at the time of the refresh operation is longer than a time for overwriting reversed data on the memory cells in the write operation, and more charges can be supplied to the memory cells at the time of the refresh operation. Therefore, the refresh cycle of memory cells on which a refresh operation has been executed once does not need to be a cycle on an assumption that the charge amount is Qmin, and the refresh cycle can be longer than that of the case of Qmin.

Focusing on this point, in the semiconductor device according to the present embodiment, reduction of power consumption is realized by setting refresh cycles of the second and following cycles to be longer than that of the first cycle.

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
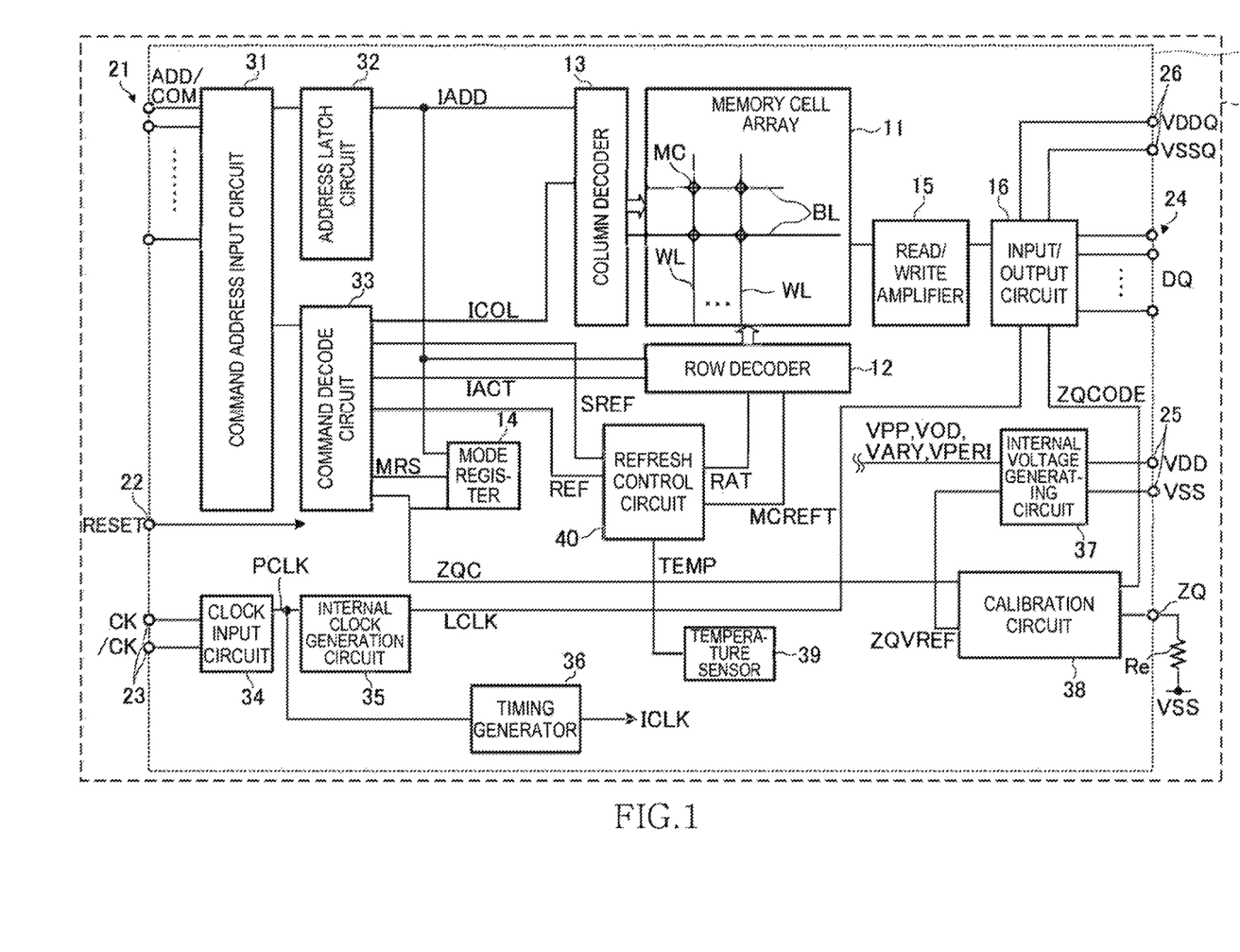
FIG. 1 is a block diagram indicative of an embodiment of an overall configuration of a semiconductor device according to an embodiment of the present invention.

Referring now to FIG. 1, the semiconductor device 10 according to an embodiment of the present invention is a DDR3 (Double Data Rate 3) DRAM integrated in a single semiconductor chip. The semiconductor device 10 is mounted on an external substrate 2 that is a memory module substrate, a mother board or the like. The external substrate 2 employs an external resistor Re that is connected to a calibration terminal ZQ of the semiconductor device 10. The external resistor Re is a reference impedance of the calibration circuit 38. In the present embodiment, a ground potential VSS is supplied to the external resistor Re.

As shown in FIG. 1, the semiconductor device 10 includes a memory cell array 11. The memory cell array 11 includes a plurality of word lines WL, a plurality of bit lines BL, and a plurality of memory cells MC arranged at their intersections. The selection of the word line WL is performed by a row decoder 12 and the selection of the bit line BL is performed by a column decoder 13.

The semiconductor device 10 employs a plurality of external terminals that include command address terminals 21, a reset terminal 22, clock terminals 23, data terminals 24, power supply terminals 25 and 26, and the calibration terminal ZQ.

The command address terminals 21 are supplied with an address signal ADD and a command signal COM from outside. The address signal ADD supplied to the command address terminals 21 is transferred via a command address input circuit 31 to an address latch circuit 32 that latches the address signal ADD. The address signal IADD latched in the address latch circuit 32 is supplied to the row decoder 12, the column decoder 13, or a mode register 14. The mode register 14 is a circuit in which parameters indicating an operation mode of the semiconductor device 10 are set.

The command signal COM input to the command terminals 21 is input to a command decode circuit 33 via the command address input circuit 31. The command decode circuit 33 decodes the command signal COM to generate various internal commands that include an active signal IACT, a column signal ICOL, refresh signals REF and SREF, a mode register set signal MRS, and a calibration signal ZQC.

The active signal IACT is activated when the command signal COM indicates a row access (an active command). When the active signal IACT is activated, the address signal IADD latched in the address latch circuit 32 is supplied to the row decoder 12. The word line WL designated by this address signal IADD is selected accordingly.

The column signal ICOL is activated when the command signal COM indicates a column access (a read command or a write command). When the column signal ICOL is activated, the address signal IADD latched in the address latch circuit 32 is supplied to the column decoder 13. In this manner, the bit line BL designated by this address signal IADD is selected accordingly.

Accordingly, when the active command and the read command are issued and a row address and a column address are supplied in synchronism with these commands, read data is read from a memory cell MC designated by these row address and column address. Read data DQ is output to outside from the data terminals 24 via a read/write amplifier 15 and an input/output circuit 16.

Meanwhile, when the active command and the write command are issued, a row address and a column address are supplied in synchronism with these commands, and then write data DQ is supplied to the data terminals 24, the write data DQ is supplied via the input/output circuit 16 and the read/write amplifier 15 to the memory cell array 11 and written in the memory cell MC designated by these row address and column address.

The refresh signal SREF is activated when the command shawl COM indicates a first refresh command. Although not limited thereto, a self-refresh entry command can be used as the first refresh command. When the refresh signal SREF is activated, the semiconductor device 10 enters into a refresh mode and periodic refresh operation is performed automatically. When the semiconductor device 10 enters into the refresh mode, the semiconductor device 10 becomes a low consumption current state, and it becomes impossible to perform a row access and a column access to the semiconductor device 10. In order to return to a normal operation mode from the refresh mode, it is necessary to input a refresh exit command to the semiconductor device 10 via the command address terminal 21 from outside. When the refresh exit command is issued, the refresh signal SRF becomes a non-active state, and the semiconductor device 10 returns to the normal operation mode.

The refresh signal REF is activated when the command signal COM indicates a second refresh command. Although not limited thereto, an auto refresh command can be used as the second refresh command.

Both of the refresh signals SREF and REF are supplied to a refresh control circuit 40. The refresh control circuit 40 controls the row decoder 12 to activate a predetermined word line WL included in the memory cell array 11, thereby executes a refresh operation. Besides the refresh signals SREF and REF, a temperature signal TEMP that is output from a temperature sensor 39 are supplied to the refresh control circuit 40. The details of the refreshment control circuit 40 are described later.

The mode register set signal MRS is activated when the command signal COM indicates a mode register set command. Accordingly, when the mode register set command is issued and a mode signal is supplied from the command address terminals 21 in synchronism with this command, a set value of the mode register 14 can be overwritten.

Turning to the explanation of the external terminals included in the semiconductor device 10, a reset signal RESET is input to the reset terminal 22. When the reset signal RESET is activated, the semiconductor device 10 performs an initialization operation.

The clock terminals 23 is supplied with external clock signals CK and /CK, respectively. These external clock signals CK and /CK are complementary to each other and then supplied to a clock input circuit 34. The clock input circuit 34 receives the external dock signals CK and /CK to generate an internal clock signal PCLK. The internal clock signal PCLK is supplied to an internal clock generation circuit 35 and thus a phase controlled internal clock signal LCLK is generated. Although not limited thereto, a DLL circuit can be used as the internal clock generation circuit 35. The internal clock signal LCLK is supplied to the input/output circuit 16 and is used as a timing signal for determining an output timing of the read data DQ. The internal clock signal PCLK is also supplied to a timing generator 36 and thus various internal clock signals ICLK are generated. The various internal clock signals ICLK generated by the timing generator 36 are supplied to circuit blocks such as the address latch circuit 32 and the command decode circuit 33 and define operation timings of these circuit blocks.

The power supply terminals 25 are supplied with poster supply potentials VDD and VSS. These power supply potentials VDD and VSS are supplied to an internal voltage generating circuit 37. The internal power supply generating circuit 37 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in sense amplifiers included in the memory cell array 11, and the internal potential VPERI is used in many other circuit blocks. The reference potential ZQVREF is used, in the calibration circuit 38.

The power supply terminals 26 are supplied with power supply potentials VDDQ and VSSQ. These power supply potentials VDDQ and VSSQ are supplied to the input/output circuit 16. The power supply potentials VDDQ and VSSQ are the same potentials as the power supply potentials VDD and VSS that are supplied to the power supply terminals 25, respectively. However, the dedicated power supply potentials VDDQ and VSSQ are used for the input/output circuit 16 so that power supply noise generated by the input/output circuit 16 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQC. An impedance code ZQCODE obtained by the calibration operation is supplied to the input/output circuit 16, and thus an impedance of an output buffer (not shown) included in the input/output circuit 16 is specified.

Figure 2:
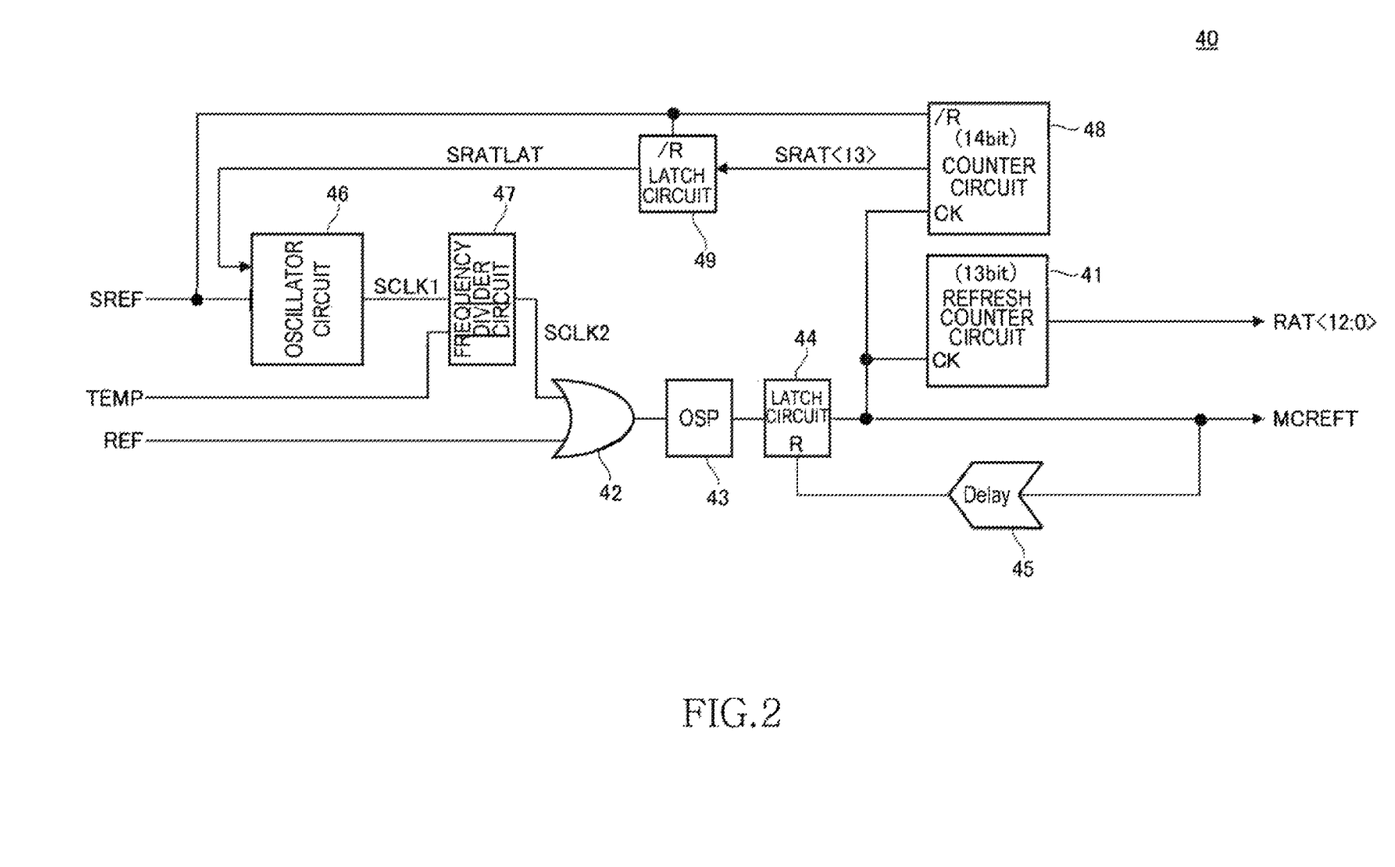
FIG. 2 is a circuit diagram indicative of an embodiment of a refresh control circuit shown in FIG. 1.

Turning to FIG. 2, the refresh control circuit 40 includes a refresh counter circuit 41 that generates a row address RAT<12:0> of the word line WL that is a refresh target. In this example, the row address RAT<12:0> represents a 13-bit signal, formed of RAT<0> to RAT<12>. The row address RAT<12:0> is supplied to the row decoder 12 shown in FIG. 1. In the present invention, a plurality of memory cells MC refreshed by a predetermined row address RAT<12:0> are sometimes referred to as "memory group".

The count value of the refresh counter circuit 41, that is, the row address RAT<12:0>, is updated (incremented or decremented) in response to a refresh execution signal MCREFT. The refresh execution signal MCREFT is activated every time the refresh signal REF or a refresh signal SCLK2 is activated. Specifically explaining this operation, the refresh signal REF or SCLK2 is supplied to an OR gate circuit 42, and an output signal therefrom is one-shot pulsed by a one-shot pulse (OSP) generation circuit 43. The one-shot pulsed output signal is latched by a latch circuit 44 and used as the refresh execution signal MCREFT. The refresh execution signal MCREFT is supplied to the row decoder 12 shown in FIG. 1, and fed back to the latch circuit 44 via a delay circuit 45. With this operation, the refresh execution signal MCREFT is activated and then returns to a deactivated state after a predetermined time period.

Figure 3:
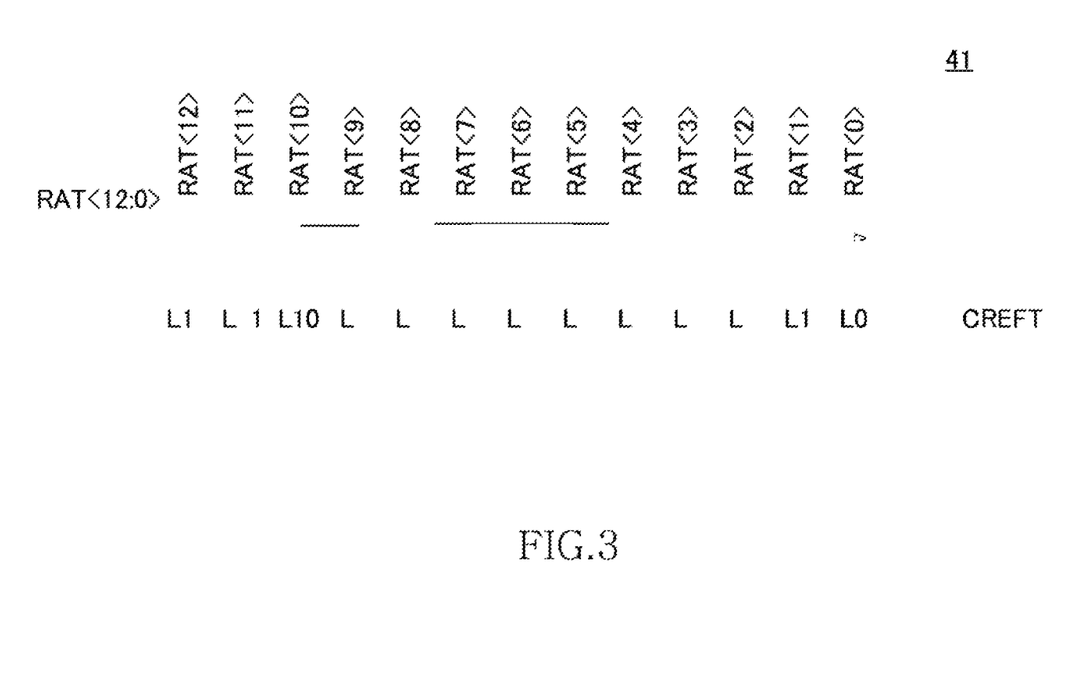
FIG. 3 is a schematic diagram indicative of an embodiment of configuration of a refresh counter circuit shown in FIG. 2.

With this configuration, when the refresh signal REF or SCLK2 is activated, a refresh operation is executed with the activation of the refresh execution signal MCREFT, and the row address RAT<12:0> indicated by the refresh counter circuit 41 is updated. As shown in FIG. 3, the refresh counter circuit 41 is a binary counter of a 13-bit configuration formed by cascade connected latch circuits L0 to L12, and outputs of the respective latch circuits L0 to L12 are used as the respective bits RAT<0> to RAT<12> of the row address RAT<12:0>.

Accordingly, when the refresh signal REF or SCLK2 is activated 8192 (=213) times, the count value of the refresh counter circuit 41 completes one cycle and then all the memory cells MC included in the memory cell array 11 are refreshed.

As described above, the refresh signal REF is a signal that is activated when the command signal COM indicates a second refresh command. Therefore, when the second refresh command is issued 8192 times, the count value of the refresh counter circuit 41 completes one cycle, and all the memory cells MC included in the memory cell array 11 are refreshed.

Meanwhile, the refresh signal SCLK2 is a signal that is generated by an oscillator circuit 46 and a frequency divider circuit 47 in response to the activation of the refresh signal SREF. Specifically, when the refresh signal SREF is activated, automatic and cyclic generation of a refresh signal SCLK1 by the oscillator circuit 46 is started, and the generated refresh signal SCLK1 is supplied to the frequency divider circuit 47. The frequency divider circuit 47 generates the refresh signal SCLK2 by dividing the refresh signal SCLK1 based on the temperature signal TEMP. The generation of the refresh signal SCLK1 by the oscillator circuit 46 is continued until a refresh exit command is issued from outside. Circuit configurations of the oscillator circuit 46 and the frequency divider circuit 47 are described later.

As shown in FIG. 2, the refresh signal SREF is also supplied to reset nodes of a counter circuit 48 and a latch circuit 49. These reset nodes are low active, and thus in a normal mode, the counter circuit 48 and the latch circuit 49 are always in a reset state. When the refresh signal SREF is activated at a high level, the reset state of the counter circuit 48 and the latch circuit 49 is canceled.

Figure 4:
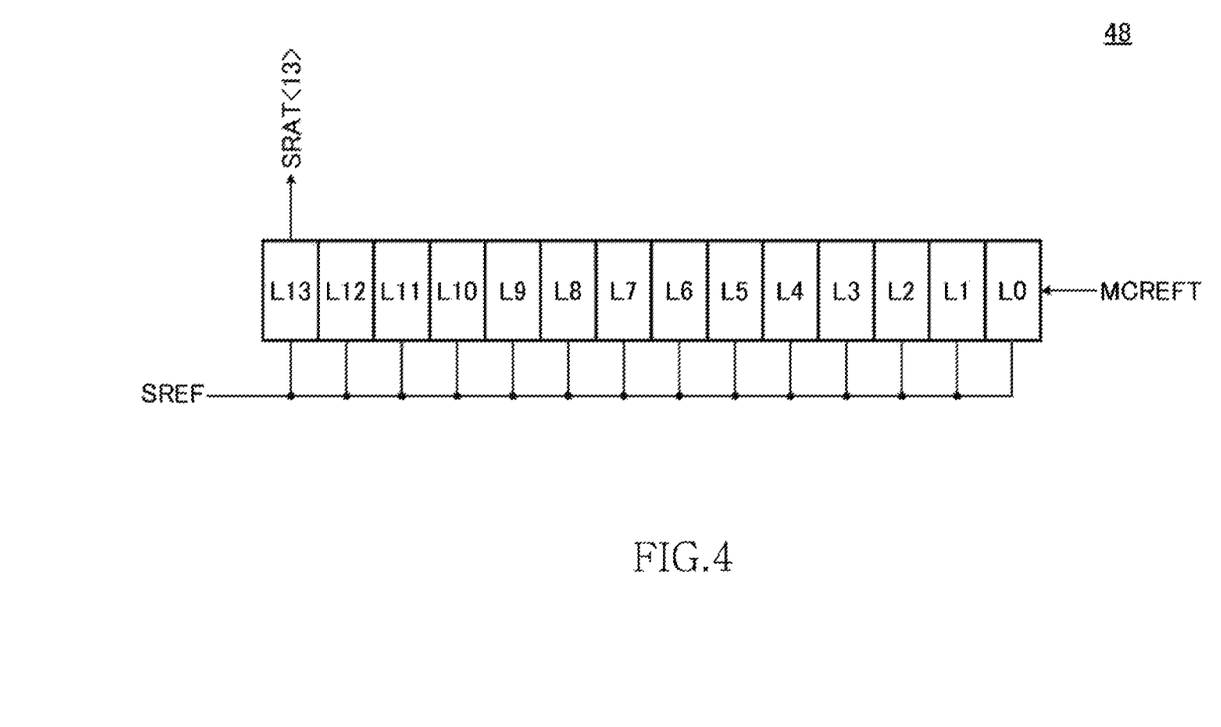
FIG. 4 is a schematic diagram indicative of an embodiment of configuration of a counter circuit shown in FIG. 2.

Turning to FIG. 4, the counter circuit 48 is a binary counter of a 14-bit configuration formed by cascade connected latch circuits L0 to L13, where a count value is updated (incremented or decremented) based on the refresh execution signal MCREFT. An output of the uppermost latch circuit L13 is used as a detection signal SRAT<13>. Accordingly, when the refresh execution signal MCREFT is activated 8192 times after the reset state of the counter circuit 48 is cancelled, the detection signal SRAT<13> is changed to a high level. Because the refresh execution signal MCREFT is also used for updating of the count value of the refresh counter circuit 41, the fact that the detection signal SRAT<13> is activated means that the count value of the refresh counter circuit 41 has just completed one cycle in a state where the refresh signal SREF is at a high level.

Turning to FIG. 2, the detection signal SRAT<13> is supplied to the latch circuit 49. The latch circuit 49 is a so-called SR (Set-Reset) latch circuit. When the detection signal SRAT<13> is activated, the latch circuit 49 is set, and then the set state is maintained until the refresh signal SREF is deactivated. A switching signal SRATLAT output from the latch circuit 49 is supplied to the oscillator circuit 46.

Figure 5:
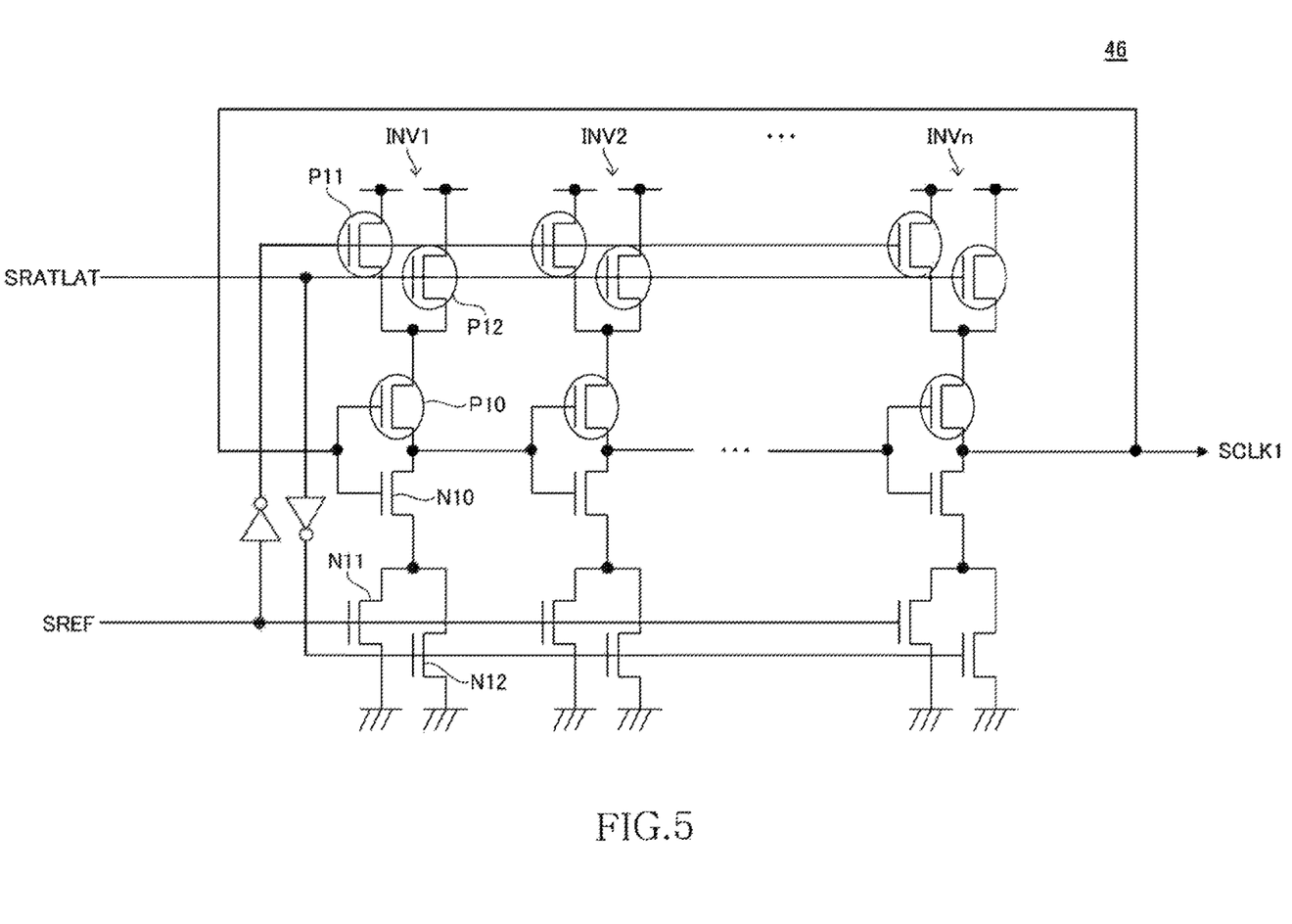
FIG. 5 is a circuit diagram indicative of an embodiment of an oscillator circuit shown in FIG. 2.

Turning to FIG. 5, the oscillator circuit 46 has a configuration in which a plurality of inverter circuits INV1 to INVn are cyclically connected to each other. The value n is an odd number. Therefore, when the oscillator circuit 46 is activated, the logical level of the refresh signal SCLK1 as the output signal of the oscillator circuit 46 is changed cyclically.

Each of the inverter circuits INV1 to INVn includes a P-channel MOS transistor P10 and are N-channel MOS transistor N10 that are connected in series, P-channel MOS transistors P11 and P12 that are connected to a source of the transistor P10, and N-channel MOS transistors N11 and N12 that are connected to a source of the transistor N10. The transistors P11 and P12 are connected in parallel to each other, and an inversion signal of the refresh signal SR EP and the switching signal SRATLAT are input to respective gate electrodes of the transistors P11 and P12. Further, the transistors N11 and N12 are connected in parallel to each other, and the refresh signal SREF and an inversion signal of the switching signal SRATLAT are input to respective gate electrodes of the transistors N11 and N12.

With this configuration, when the refresh signal SREF is activated at a high level, an oscillator operation is started and the logical level of the refresh signal SCLK1 is cyclically changed. At this time, when the switching signal SRATLAT is in a deactivated state (at a low level), not only the transistors P11 and N11 but also the transistors P12 and N12 are turned on, and thus the driving capability of the inverter circuits INV1 to INVn becomes large. As a result, the cycle of changing the refresh signal SCLK1 becomes short. On the other hand, when the switching signal SRATLAT is in an activated state (at a high level), while the transistors P11 and N11 are turned on, the transistors P12 and N12 are turned off, and thus the driving capability of the inverter circuits INV1 to INVn becomes small. As a result, in this case, the cycle of changing the refresh signal SCLK1 becomes long.

It is not necessary that the driving capability of all the inverter circuits INV1 to INVn can be changed, and it is permissible that the driving capability of only a part of the inverter circuits INV1 to INVn can be changed.

The refresh signal SCLK1 generated as described above is supplied to the frequency divider circuit 47.

Figure 6:
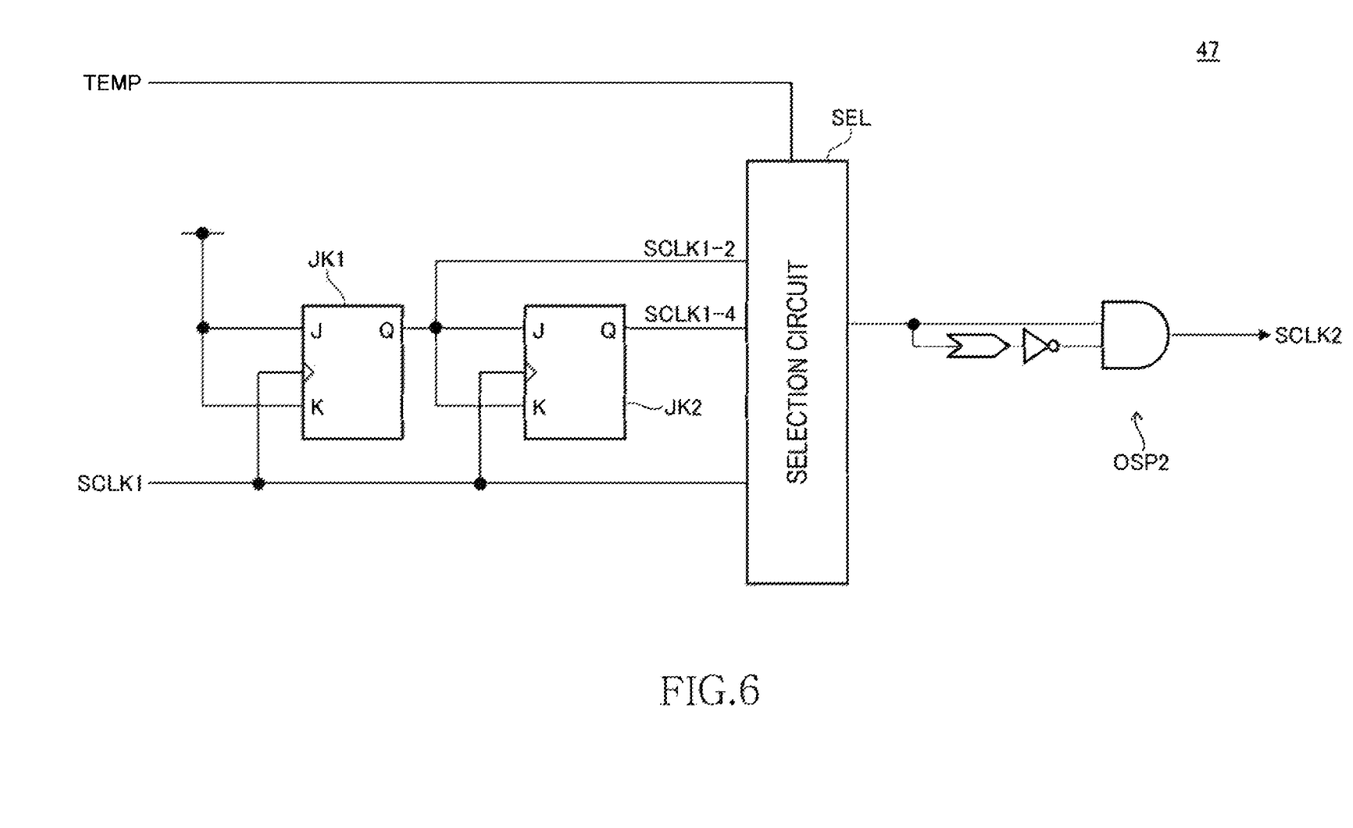
FIG. 6 is a circuit diagram indicative of an embodiment of a frequency divider circuit shown in FIG. 2.

Turning to FIG. 6, the frequency divider circuit 47 includes two JK flit-flop circuits JK1 and JK2, a selection circuit SEL, and a one-shot pulse generation circuit OSP2 that makes an output signal from the selection circuit SEL one-shot pulsed. The JK flip-flop circuits JK1 and JK2 are cascade connected to each other, and both input nodes J and K of the first-stage JK flip-flop circuit JK1 are fixed to a high level. With this configuration, because the JK flip-flop circuit JK1 executes a toggle operation based on the refresh signal SCLK1, a refresh signal SCLK1-2 as an output signal of the JK flip-flop circuit JK1 has a waveform of dividing the refresh signal SCLK1 into two parts. Further, a refresh signal SCLK1-4 output from the next-stage JK flip-flop circuit JK2 has a waveform of dividing the refresh signal SCLK1 into four parts.

The refresh signals SCLK1, SCLK1-2, and SCLK1-4 are supplied to the selection circuit SEL. The selection circuit SEL selects any one of the refresh signals SCLK1, SCLK1-2, and SCLK1-4 based on the temperature signal TEMP. Specifically, the refresh signal SCLK1 is selected when the temperature signal TEMP indicates a temperature that can obtain a normal refresh characteristic, the refresh signal SCLK1-2 is selected when the temperature signal TEMP indicates a temperature that can obtain a refresh characteristic which is better than a normal refresh characteristic, and the refresh signal SCLK1-4 is selected when the temperature signal TEMP indicates a temperature that can obtain a refresh characteristic which is much better than a normal refresh characteristic. With this configuration, the output signal of the selection circuit SEL is changed at a cycle corresponding to an actual refresh characteristic (that is, a data retention period of the memory cells MC).

The output signal of the selection circuit SEL is supplied to the one-shot pulse generation circuit OSP2, and is output as a one-shot pulsed refresh signal SCLK2. The one-shot pulsed refresh signal SCLK2 is supplied to the OR gate circuit 42 shown in FIG. 2. Therefore, when the refresh signal SCLK2 is activated, a refresh operation similar to that of a case where the refresh signal REF is activated is executed.

Operations of the semiconductor device 10 according to the present embodiment are explained next as focusing on a refresh operation.

Figure 7:
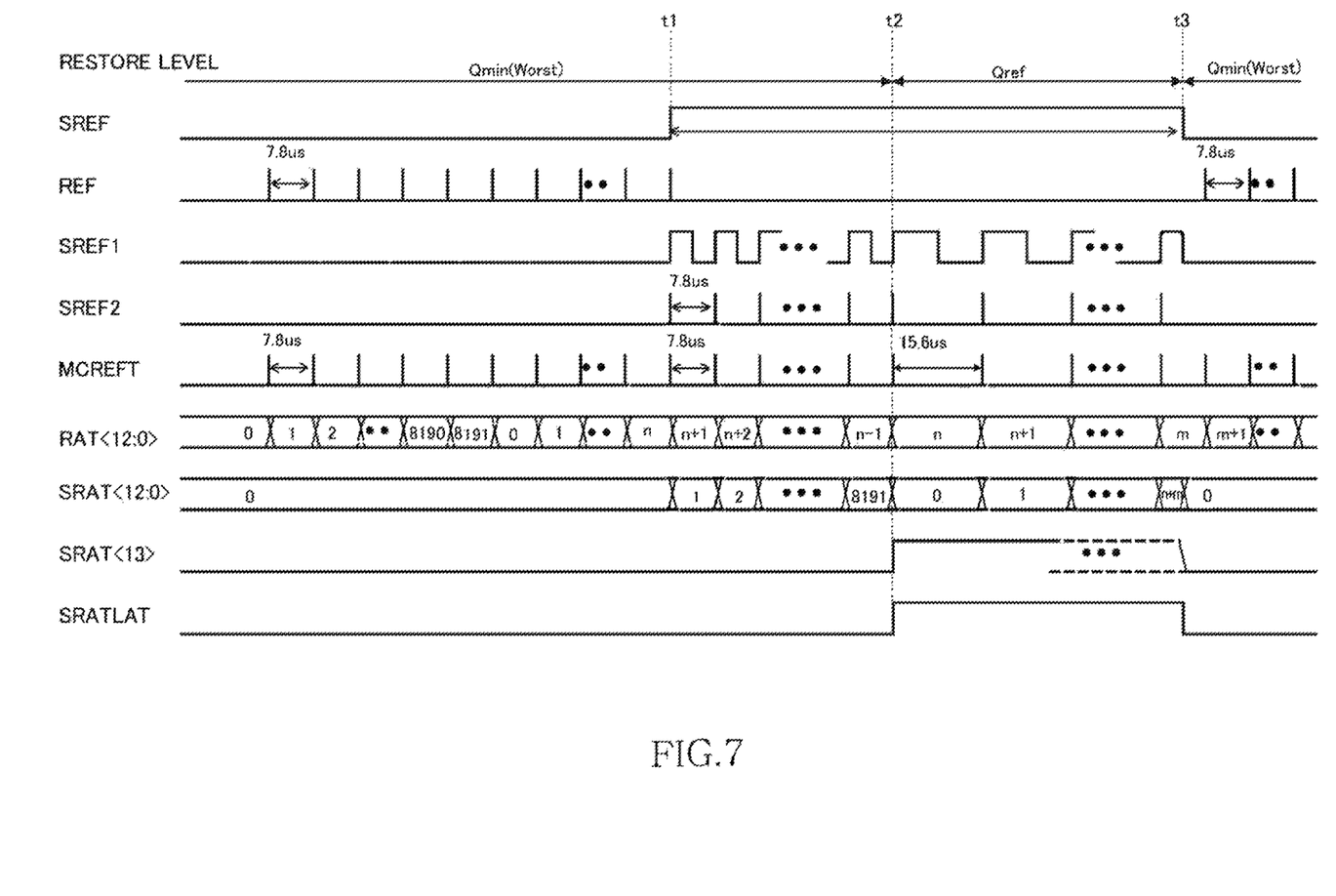
FIG. 7 is a timing diagram for explaining a refresh operation of the semiconductor device shown in FIG. 1.

Turning to FIG. 7, a first refresh command is issued at a time t1. In response to the first refresh command, the refresh signal SREF is activated at a high level at the time t1, and the semiconductor device 10 enters a refresh mode. Thereafter, a refresh exit command is issued at a time t3, and the refresh signal SREF is deactivated at a low level. With this process, the semiconductor device 10 returns to a normal mode.

Before the time t1, because the semiconductor device 10 is operated at a normal mode, a read command or a write command is issued from a control device (not shown) when necessary, and the semiconductor device 10 executes a read operation or a write operation in response to the issued command. Further, in the normal mode, a second refresh command is issued regularly from the control device. When, the second refresh command is issued, the refresh signal REF is activated. When the refresh signal REF is activated, as explained with reference to FIG. 2, a refresh operation is executed on the row address RAT<12:0> that is indicated by the refresh counter circuit 41.

The second refresh command is issued in a frequency during which all the memory cells MC are refreshed in one refresh cycle (such as 64 msec). In the present embodiment, because the row address RAT<12:0> has a 13-bit configuration, the second refresh command is issued 8192 (=213) times in one refresh cycle. Therefore, as one refresh cycle is assumed to be 64 msec, an average issuing frequency of the second refresh command becomes 7.8 μsec. While an example in which the second refresh command is issued at every 7.8 μsec is shown in FIG. 7, it suffices that the issuing frequency of the second refresh command is 7.8 μsec on average, and the second refresh command does not need to be issued exactly at every 7.8 μsec.

When the first refresh command is issued at the time t1, the refresh signal SREF is activated at a high level, and the semiconductor device 10 enters a refresh mode. When the semiconductor device 10 enters a refresh mode, the oscillator circuit 46 shown in FIG. 2 is activated, and automatic and cyclic generation of the refresh signal SCLK1 is started. Further, in a period before the time t1, the counter circuit 48 and the latch circuit 49 are kept in a reset state, and the reset state is cancelled at the time t1. Accordingly, the count value of the counter circuit 48 before the time t1 is 0 (zero), and the switching signal SRATLAT before the time t1 is in a low-level state.

When the switching signal SRATLAT is at a low level, as explained above with reference to FIG. 5, the cycle of changing the refresh signal SCLK1 becomes short. Therefore, the refresh execution signal MCREFT is activated in a predetermined short cycle (first cycle), and a regular refresh operation is executed automatically. In this example, the selection circuit SEL included in the frequency divider circuit 47 selects the refresh signal SCLK1, and thus the cycle in which the refresh signal SCLK2 is activated matches the cycle in which the refresh signal SCLK1 is activated.

In the example shown in FIG. 7, the first cycle is 7.8 μsec and the first cycle matches an average issuing frequency of the second refresh command. This is because, in a state where the semiconductor device 10 has just entered a refresh mode, there are memory cells with a charge amount of Qmin, and thus the refresh execution signal MCREFT needs to be activated in a short cycle (first cycle) on an assumption that the charge amount of the respective memory cells is Qmin.

Thereafter, incrementing or decrementing of the refresh counter circuit 41 and the counter circuit 48 is progressed by regular activation of the refresh execution signal MCREFT. In the example shown in FIG. 7, the refresh execution signal MCREFT is activated 8192 times during a period between the time t1 and a time t2. That is, at the time t2, the value of the row address RAT<12:0> as the count value of the refresh counter circuit 41 completes one cycle, and the value returns to n, which is a value just before the semiconductor device 10 enters a refresh mode. At this time, the count value of the counter circuit 48 indicates 8192.

When the count value of the counter circuit 48 changes from 8191 to 8192, the detection signal SRAT<13> is changed to a high level, and in response to this change, the switching signal SRATLAT is also activated at a high level.

When the switching signal SRATLAT is changed to a high level, as explained with reference to FIG. 5, the activation cycle of the refresh signal SCLK1 is extended. Therefore, the refresh execution signal MCREFT is activated in a predetermined long cycle (second cycle), and a regular refresh operation is executed automatically. In the example shown FIG. 7, the second cycle is 15.6 μsec, and it is twice the first cycle. With this configuration, the execution frequency of the refresh operation is decreased to one-half and thus current consumption of the semiconductor device 10 is further reduced.

Such control is possible because, when the count value of the refresh counter circuit 41 completes one cycle, the charge amount of all the memory cells becomes Qref. As explained above, because Qref is larger than Qmin, after the time t2, a state where the data retention period of all the memory cells MC is longer than that of in a normal mode is guaranteed. In this example, the data retention period of all the memory cells MC is equal to or more than 128 msec. Therefore, as the refresh execution signal MCREFT is activated at every 15.6 μsec, it is possible to activate the refresh execution signal MCREFT 8192 times during the period of 128 msec, that is, it is possible to refresh all the memory cells MC during the period of 128 msec.

Subsequently, the refresh execution signal MCREFT is activated at every 15.6 μsec, and the count value of the counter circuit 48 is updated in response to the activation; however, because the SR latch circuit 49 is kept in a set state, the switching signal SRATLAT is maintained at a high level regardless of the change of the detection signal SRAT<13>.

Thereafter, when a refresh exit command is issued at the time t3, the refresh signal SREF becomes a low level, and the semiconductor device 10 returns from a refresh mode to a normal mode. After returning to a normal mode, operations identical to those before the time t1 are executed.

As explained above, in the present embodiment, after the semiconductor device 10 enters a refresh mode, when all the memory cells MC are refreshed, the generation cycle of the refresh execution signal MCREFT is elongated. With this configuration, current consumption of the semiconductor device 10 can be further reduced while properly maintaining data of the memory cells MC. Further, by using the refresh control circuit 40 shown in FIG. 2, when the count value of the refresh counter circuit 41 has just completed one cycle, the generation cycle of the refresh execution signal MCREFT is switched from the first cycle to the second cycle, so that effective reduction of current consumption can be made.

Figure 8:
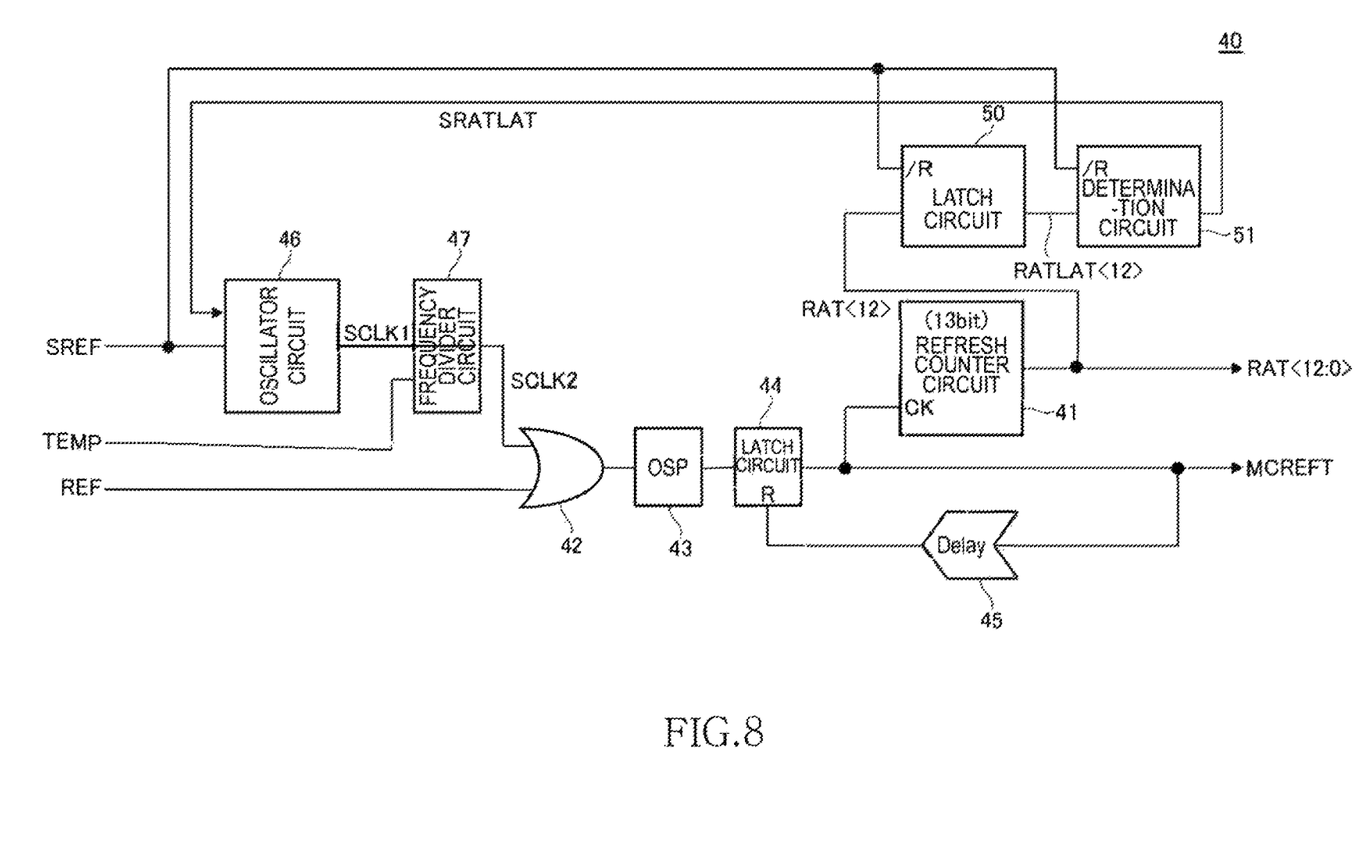
FIG. 8 is a circuit diagram indicative of an embodiment of a refresh control circuit according to a second embodiment of the present invention.

Turning to FIG. 8, the refresh control circuit 40 is different from the refresh control circuit 40 shown in FIG. 2 in that a latch circuit 50 and a determination circuit 51 are provided in place of the counter circuit 48 and the latch circuit 49. Because other elements of the refresh control circuit 40 shown in FIG. 8 are identical to those of the refresh control circuit 40 shown in FIG. 2, like reference numerals are denoted to like elements and redundant explanations thereof will be omitted.

The latch circuit 50 is a circuit that latches the upper-most bit RAT<12> among the bits of the row address RAT<12:0> output from the refresh counter circuit 41, and the latch circuit 50 is maintained in a reset state during a period where the refresh signal SREF is at a low level. A latch signal RATLAT<12> output from the latch circuit 50 is supplied to the determination circuit 51. When the determination circuit 51 detects a change of the latch signal RATLAT<12> with a predetermined pattern, the determination circuit 51 activates the switching signal SRATLAT at a high level. The determination circuit 51 is also maintained in a reset state during a period where the refresh signal SREF is at a low level. Therefore, when the latch signal RATLAT<12> changes with a predetermined pattern after the refresh signal SREF is changed to a high level, the switching signal SRATLAT becomes a high level.

Figure 9:
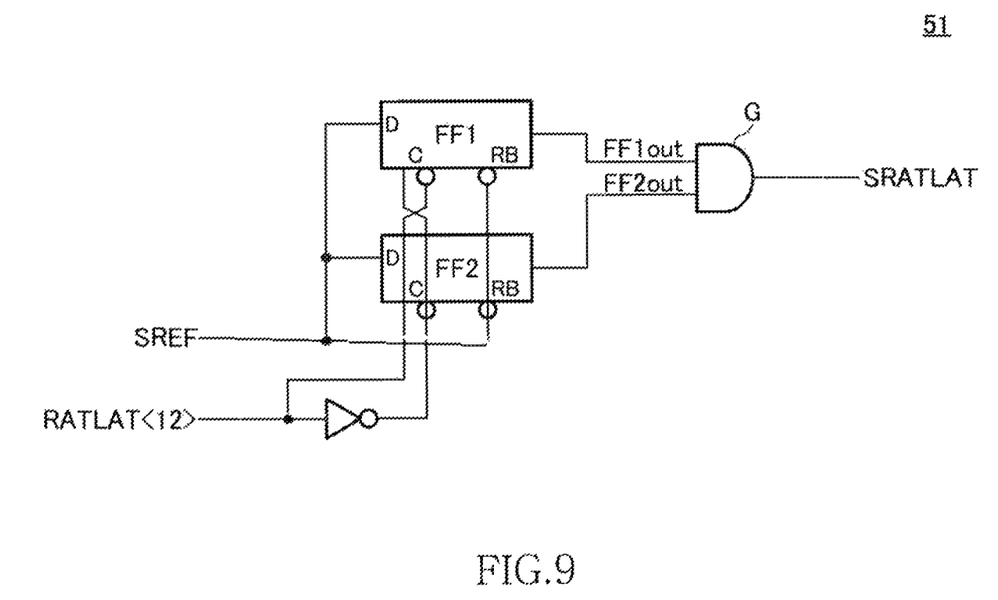
FIG. 9 is a circuit diagram indicative of an embodiment of a determination circuit shown in FIG. 8.

Turning to FIG. 9, the determination circuit 51 includes two flip-flop circuits FF1 and FF2, and output signals FF1out and FF2out from these flip-flop circuits are supplied to an AND gate circuit G. Each of the flip-flop circuits FF1 and FF2 includes a data node D, a complimentary clock node C, and a low-active reset node RB. The refresh signal SREF is input to the data node D and the reset node RB, and the latch signal RATLAT<12> and an inversion signal thereof are input to the clock node C.

As shown in FIG. 9, the logic of the latch signal RATLAT<12> input to the clock node C is inverted between the flip-flop circuits FF1 and FF2. Therefore, when the latch signal RATLAT<12> is changed from a high level to a low level, the level of the refresh signal SREF is latched to the flip-flop circuit FF1, whereas when the latch signal RAT-LAT<12> is changed from a low level to a high level, the level of the refresh signal SREF is latched to the flip-flop circuit FF2. When the refresh signal SREF is at a deactivated level (a low level), the flip-flop circuits FF1 and FF2 are reset.

With this configuration, under a condition that the refresh signal SREF is activated at a high level, when the latch signal RATLAT<12> is inverted twice, both of the output signals FF1out and FF2out become a high level, and the switching signal SRATLAT output from the AND gate circuit G is activated at a high level.

That is, after activation of the refresh signal SREF at a high level, when the level of the latch signal RATLAT<12> is changed as H→L→H or L→H→PL, the switching signal SRATLAT becomes a high level. The latch signal RATLAT<12> is changed with such patterns only after the count value of the refresh counter circuit 41 completes one cycle. Therefore, as the switching signal SRATLAT is changed to a high level by using the change of the latch signal RATLAT<12> as a trigger, after refreshing all the memory cells MC in a refresh mode, it becomes possible to elongate the generation cycle of the refresh execution signal MCREFT. Furthermore, because the circuit configuration of the refresh control circuit 40 shown in FIG. 8 is simpler than that of the refresh control circuit 40 shown in FIG. 2, the occupation area of the refresh control circuit 40 on a chip can be decreased.

It is apparent that the present invention is not limited to the above embodiments, but may be modified and changed without departing from the scope and spirit of the invention.

In the above embodiment, a case where the present invention is applied to a DRAM has been explained as an example; however, application targets of the present invention are not limited thereto, and the present invention can be applied to any type of semiconductor devices including a plurality of memory cells that require information storage by a refresh operation.

Furthermore, in the above embodiment, the generation cycle of the refresh execution signal MCREFT is elongated when all the memory cells MC are refreshed in a refresh mode; however, this feature is not necessarily essential. Therefore, it is permissible that the generation cycle of the refresh execution signal MCREFT is elongated when the majority of all the memory cells MC (such as 90% of the memory cells MC) are refreshed in a refresh mode. This is because the rest of the majority of the memory cells (such as 10% of the memory cells MC) that are not refreshed yet will be also refreshed soon after the elongation of the generation cycle.

Further, in the above embodiment, the activation cycle of the refresh signal SCLK2 is switched by changing the frequency division ratio of the refresh signal SCLK1 based on the temperature signal TEMP; however, in the present invention, control of refresh cycles based on temperature information is not essential. Therefore, it is permissible to omit the frequency divider circuit 47 and to input the refresh signal SCLK1 directly to the OR gate circuit 42.

What is claimed is:

1. An apparatus comprising:
    a first control circuit configured to produce a refresh address, the first control circuit being further configured to be brought into a self-refresh mode responsive to a self-refresh command to update the refresh address intermittently until the self-refresh mode exits;
    a memory cell array including a plurality of groups of memory cells, the plurality of groups of memory cells being configured to be refreshed in sequence responsive to the first control circuit updating the refresh address intermittently; and
    a second control circuit configured to produce a control signal indicating that the first control circuit has updated the refresh address until all of the plurality of groups of memory cells is refreshed;
    wherein the first control circuit is further configured to update the refresh address at first intervals until the control signal is produced from the second control circuit and at second intervals after the control signal has been produced from the second control circuit, the first intervals being different from the second intervals; and
    wherein the second control circuit comprises a plurality of latch circuits provided independently of the first control circuit, the plurality of latch circuits being configured to produce the control signal indicating that the first control circuit has updated the refresh address until all of the plurality of groups of memory cells is refreshed.

2. The apparatus of claim 1, wherein the plurality of latch circuits are coupled in cascade to form a counter circuit, the counter circuit being configured to update a count value thereof each time the first control circuit updates the refresh address.

3. The apparatus of claim 2, wherein the first control circuit includes an oscillator circuit configured to output a first refresh signal intermittently at the first intervals until the control signal is produced from the second control circuit and at third intervals after the control signal has been produced, the third intervals being different from the first intervals.

4. The apparatus of claim 3, wherein the oscillator circuit is further configured to change a driving capability thereof responsive to the control signal.

5. The apparatus of claim 2, wherein the first control circuit further includes:
    a frequency divider circuit configured to provide a second refresh signal produced by dividing the first refresh signal and output the first refresh signal when a temperature signal takes a first value; and
    a refresh counter configured to update the refresh address intermittently responsive the first refresh signal outputted by the frequency divider circuit when the temperature signal takes the first value such that the second intervals become equal to the third intervals.

6. The apparatus of claim 5, wherein the frequency divider circuit is further configured to output the second refresh signal when the temperature signal takes a second value different from the first value; and
    the refresh counter is further configured to update the refresh address intermittently responsive to the second refresh signal outputted by the frequency divider circuit when the temperature signal takes the second value such that the second intervals become equal to multiple times as long intervals as the third intervals.

7. The apparatus of claim 1, wherein the refresh address comprises a plurality of bits, and the plurality of latch circuits include at least two latch circuits each configured to receive data of a most significant bit of the plurality of bits to produce the control signal.

8. The apparatus of claim 7, wherein one of the two latch circuits is configured to activate an output node thereof when the most significant bit changes from a first logic level to a second logic level, another of the two latch circuits is configured to activate an output node thereof when the most significant bit changes from the second logic level to the first logic level, and the control signal is produced when both output nodes of the two latch circuits have been activated.

9. The apparatus of claim 7, wherein the first control circuit includes an oscillator circuit configured to output a first refresh signal intermittently at the first intervals until the control signal is produced from the second control circuit and at third intervals after the control signal has been produced, the third intervals being different from the first intervals.

10. The apparatus of claim 9, wherein the oscillator circuit is further configured to change a driving capability thereof responsive to the control signal.

11. The apparatus of claim 9, wherein the first control circuit further includes:
- a frequency divider circuit configured to provide a second refresh signal produced by dividing the first refresh signal, output the first refresh signal when a temperature signal takes a first value and output the second refresh signal when the temperature signal takes a second value; and
- a refresh counter configured to update the refresh address intermittently responsive the first refresh signal outputted by the frequency divider circuit when the temperature signal takes the first value such that the second intervals become equal to the third intervals and update the refresh address intermittently responsive to the second refresh signal outputted by the frequency divider when the temperature signal takes the second value such that the second intervals become equal to multiple times as long intervals as the third intervals.

12. An apparatus comprising:
- a first control circuit configured to provide a refresh address that is updated intermittently when in a self-refresh mode;
- a memory cell array including a plurality memory cells, the plurality of memory cells configured to be refreshed responsive to the refresh address updating intermittently; and
- a second control circuit configured to provide a control signal indicating that the refresh address provided by the first control circuit has been updated intermittently until the plurality of memory cells are refreshed;
- wherein the first control circuit is further configured to update the refresh address intermittently to refresh the plurality of memory cells at a first cycle until the control signal indicates that all the plurality of memory cells are refreshed, and wherein the refresh address is updated intermittently to refresh the plurality of memory cells at a second cycle thereafter when in the self-refresh mode, the second cycle different than the first cycle; and
- wherein the second control circuit includes a plurality of latch circuits configured to provide the control signal.

13. The apparatus of claim 12, wherein the plurality of latch circuits are included in a counter circuit, and wherein the counter circuit provides control signal indicating that the refresh address provided by the first control circuit has been updated intermittently until the plurality of memory cells are refreshed when a maximum count value is reached.

14. The apparatus of claim 13, wherein the first control circuit comprises an oscillator circuit configured to provide an oscillating signal having a first frequency responsive to the control signal not indicating that the refresh address provided by the first control circuit has been updated intermittently until the plurality of memory cells are refreshed and further configured to provide the oscillating signal having a second frequency responsive to the control signal indicating that the refresh address provided by the first control circuit has been updated intermittently until the plurality of memory cells are refreshed.

15. The apparatus of claim 14, wherein the first control circuit further comprises a divider circuit configured to provide a second oscillating signal having a frequency that is less than the frequency of the oscillating signal from the oscillator circuit, and wherein the frequency of the second oscillating signal is based at least in part on a temperature signal indicative of a temperature.

16. The apparatus of claim 12, wherein the first control circuit includes a counter circuit configured to provide the refresh address, and wherein a first latch circuit of the plurality of latch circuits is configured to latch a most significant bit of the refresh address and a second latch circuit of the plurality of latch circuits is configured to receive the latched most significant bit of the refresh address from the first latch circuit, the second latch circuit further configured to provide the control signal responsive to the latched most significant bit of the refresh address.

17. The apparatus of claim 16, wherein the second circuit comprises a determination circuit configured to provide the control signal responsive to the latched most significant bit of the refresh address.

18. A method comprising:
- intermittently updating a refresh address in a self-refresh mode;
- providing a control signal indicating that the refresh address has been updated intermittently until a plurality of memory cells of a memory cell array are all refreshed;
- wherein the refresh address is updated intermittently to refresh the plurality of memory cells at a first cycle until the control signal indicates that all the plurality of memory cells are refreshed, and wherein the refresh address is updated intermittently to refresh the plurality of memory cells at a second cycle thereafter when in the self-refresh mode, the second cycle different than the first cycle; and
- wherein the control signal is provided by a plurality of latch circuits.

19. The method of claim 18, wherein intermittently updating the refresh address in the self-refresh mode comprises:
- activating an oscillator circuit to provide a cyclic signal; and
- counting a value responsive to the cyclic signal, wherein the value is provided as the refresh address.

20. The method of claim 18, wherein the control signal is provided by a counter circuit and the control signal is based at least in part on a most significant bit of a count value provided by the counter circuit.

* * * * *